(12) United States Patent
Jin et al.

(10) Patent No.: US 8,633,777 B2
(45) Date of Patent: Jan. 21, 2014

(54) METHODS AND APPARATUS FOR INDUCTORS WITH INTEGRATED PASSIVE AND ACTIVE ELEMENTS

(75) Inventors: Zhang Jin, San Diego, CA (US); Aristotele Hadjichristos, San Diego, CA (US); Ockgoo Lee, Atlanta, GA (US); Hongyan Yan, San Diego, CA (US); Guy Klemens, San Diego, CA (US); Maulin P. Bhagat, San Diego, CA (US); Thomas Myers, San Diego, CA (US); Norman L. Frederick, San Diego, CA (US); Junxiong Deng, San Diego, CA (US); Aleksandar Tasic, San Diego, CA (US); Bhushan S. Asuri, San Diego, CA (US); Mohammad Farazian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 164 days.

(21) Appl. No.: 12/628,502

(22) Filed: Dec. 1, 2009

(65) Prior Publication Data

US 2011/0128084 A1 Jun. 2, 2011

(51) Int. Cl.
*H03B 1/00* (2006.01)
(52) U.S. Cl.
USPC ............... 331/167; 331/117 R; 331/117 FE
(58) Field of Classification Search
USPC ........ 331/96, 99, 100, 108 G, 117 R, 117 FE, 331/117 D, 167, 175, 177 R, 177 V, 185, 186
See application file for complete search history.

(56) References Cited

U.S. PATENT DOCUMENTS

| 4,857,893 | A | * | 8/1989 | Carroll | 340/572.7 |
| 4,999,742 | A | | 3/1991 | Stampfli | |
| 6,784,518 | B1 | * | 8/2004 | Merckel et al. | 257/531 |
| 7,283,035 | B2 | * | 10/2007 | Tuttle et al. | 340/10.1 |
| 2009/0257529 | A1 | * | 10/2009 | Popplewell et al. | 375/320 |

FOREIGN PATENT DOCUMENTS

| WO | WO2008011459 A2 | 1/2008 |
| WO | WO2008037579 A1 | 4/2008 |

OTHER PUBLICATIONS

Zhang et al., "Design of Components and Circuits Underneath Integrated Inductors", IEEE Journal of Solid-State Circuits, vol. 41, No. 10, pp. 2265-2271, Oct. 2006.
Gao et al., "Fully Integrated Dual Broadband Direct-Conversion Tuner Chip for Digital Satellite TV Applications", IEEE 2005 Custom Integrated Circuits Conference, pp. 353-356.
Fu et al., "A 5-GHz, 30-dBm, 0.9-dB Insertion Loss Single-Pole Double-Throw T/R Switch in 90nm CMOS", 2008 IEEE Radio Frequency Integrated Circuits Symposium, pp. 317-320, Intel Corporation, Oregon and National Chiao-Tung University, Taiwan.
Borremans et al., "A 400μW 4.7-to-6.4 GHz VCO under an Above-IC Inductor in 45nm CMOS", ISSCC 2008, Session 29, TD: Trends in Communication Circuits & Systems, 29.8, Feb. 6, 2008.

(Continued)

*Primary Examiner* — Arnold Kinkead
(74) *Attorney, Agent, or Firm* — Kevin T. Cheatham

(57) ABSTRACT

An integrated circuit is described. The integrated circuit includes an inductor that has a large empty area in the center of the inductor. The integrated circuit also includes additional circuitry. The additional circuitry is located within the large empty area in the center of the inductor. The additional circuitry may include a capacitor bank, transistors, electrostatic discharge (ESD) protection circuitry and other miscellaneous passive or active circuits.

29 Claims, 16 Drawing Sheets

(56) References Cited

OTHER PUBLICATIONS

Nastos et al., "RF Operation of MOSFETs Under Integrated Inductors", IEEE Transactions on Microwave Theory and Techniques, vol. 54, No. 5, pp. 2106-2117, May 2006.

Aoki et al., "A Fully-Integrated Quad-Band GSM/GPRS CMOS Power Amplifier", IEEE Journal of Solid-State Circuits, vol. 43, No. 12, pp. 2747-2758, Dec. 2008.

International Search Report and Written Opinion—PCT/US2010/058619, International Search Authority—European Patent Office—Feb. 15, 2011.

Rahul Magoon: "Integrated CMOS Power Amplifier for GSM/GPRS Mobile Handsets—AXIOM Presentation" AXIOM Microdevices INC presents, the Industry's first fully Integrated CMOS Power Amplifier for GSM/GPRS Mobile Handsets. Jul. 24, 2007, pp. 1-27.

Taiwan Search Report—TW099141776—TIPO—May 1, 2013.

\* cited by examiner

METHODS AND APPARATUS FOR INDUCTORS WITH INTEGRATED PASSIVE AND ACTIVE ELEMENTS

TECHNICAL FIELD

The present disclosure relates generally to communication systems. More specifically, the present disclosure relates to methods and apparatus for inductors with integrated passive and active elements.

BACKGROUND

Wireless communication systems are widely deployed to provide various types of communication content such as voice, video, data, and so on. These systems may be multiple-access systems capable of supporting simultaneous communication of multiple terminals with one or more base stations.

A terminal or a base station may include one or more integrated circuits. These integrated circuits may include analog and digital circuitry necessary for wireless communication. Such circuitry may include inductors. As the technology used to build integrated circuits progresses, active elements on the integrated circuit such as transistors continue to decrease in size. Passive elements on the integrated circuit may not decrease in size relative to the active elements. Therefore, integrated circuits built with progressive technology may require increasing percentages of area on the integrated circuit for passive elements. To decrease production costs and save area, active elements may be built under the passive elements on an integrated circuit.

SUMMARY

An integrated circuit is described. The integrated circuit includes an inductor and additional circuitry. The inductor has an empty area in the center of the inductor. The additional circuitry is located within the empty area in the center of the inductor.

In various configurations, the additional circuitry may include a capacitor bank, a tuning capacitor, a supply voltage pad, a resistor capacitor (RC) clamp, a ground pad, an electrostatic discharge (ESD) pad or electrostatic discharge (ESD) protection circuitry. Furthermore, the additional circuitry may include at least one of transistors, memory, switches, additional inductors, active circuit blocks and passive circuit blocks.

The inductor may be part of any circuit that requires an inductor. As one possible example, the inductor may be a tank inductor that is part of a voltage controlled oscillator (VCO) or a low noise amplifier (LNA). In a further example, the inductor may be a degeneration inductor that is part of a low noise amplifier (LNA).

In another configuration, the inductor may be a balun. The additional circuitry may include at least one of input tuning capacitors, output tuning capacitors, a ground pad, a supply pad, and electrostatic discharge (ESD) protection structures for the supply pad.

The inductance and quality factor (Q) of the inductor may not be negatively affected by the additional circuitry. The inductor and the additional circuitry may be located on the same layer of the integrated circuit.

A method for providing circuitry within an inductor is also described. An inductor on an integrated circuit is provided. Additional circuitry is provided within the inductor. Interaction between the inductor and the circuitry is optimized.

An apparatus for providing circuitry within an inductor is also disclosed. The apparatus includes means for providing an inductor on an integrated circuit and means for providing additional circuitry within the inductor. The apparatus also includes means for optimizing interaction between the inductor and the circuitry.

Another integrated circuit is also disclosed. The integrated circuit includes an inductor and additional circuitry. The additional circuitry is located underneath the inductor, and the inductor may be a choke inductor.

The choke inductor may be part of a voltage controlled oscillator (VCO). The inductor may have minimal capacitive coupling. The additional circuitry may include transistors or capacitors. Additionally, the additional circuitry may include a mid voltage generator for voltage controlled oscillator (VCO) calibration.

DETAILED DESCRIPTION

Figure 1:
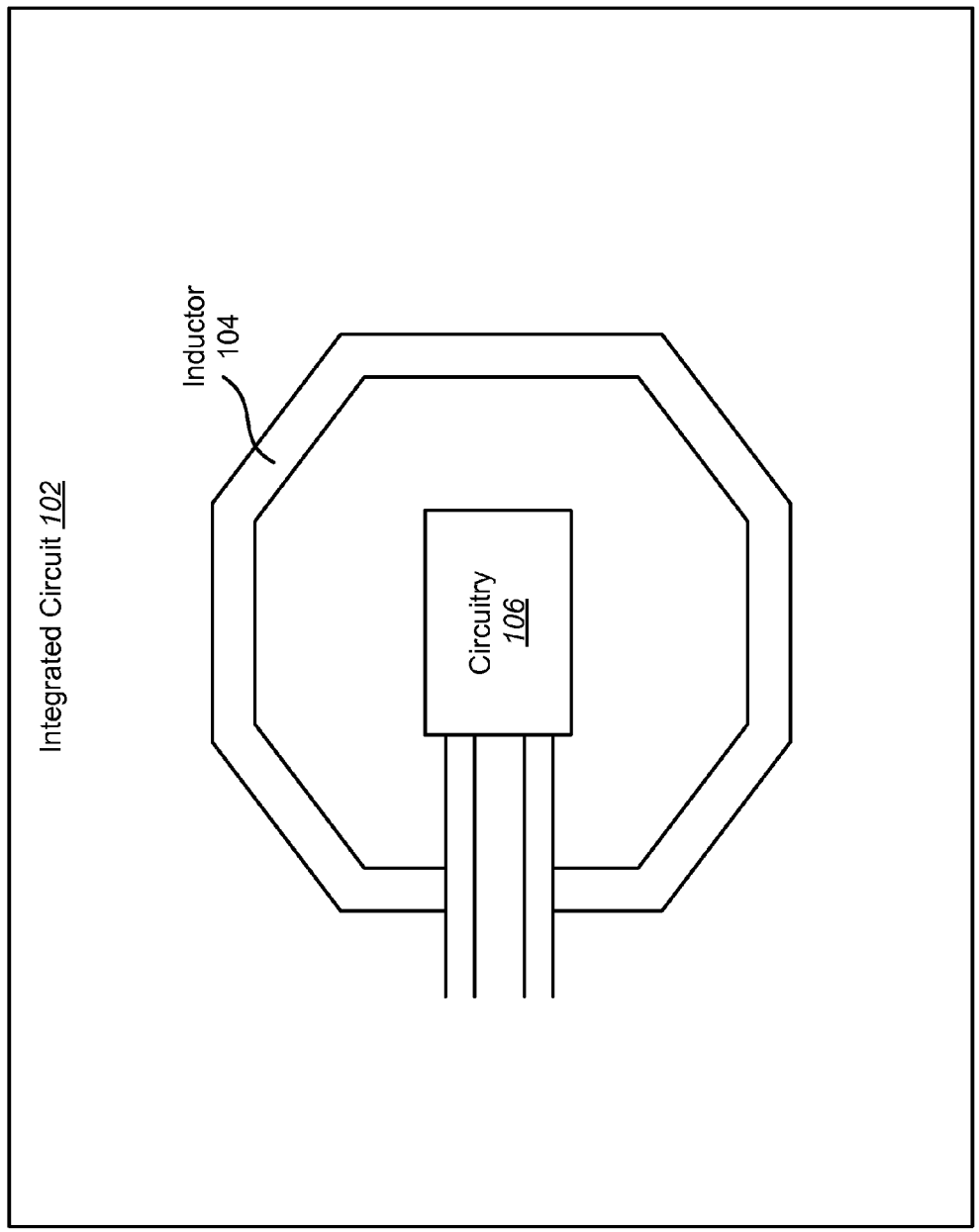
FIG. 1 shows an integrated circuit with multiple components including an inductor and additional circuitry.

FIG. 1 shows an integrated circuit 102 with multiple components including an inductor 104 and additional circuitry 106. The integrated circuit 102 may be designed for use in a wireless device such as a base station, a mobile device, or the like. A base station may also be referred to as, and may include some or all of the functionality of, an access point, a broadcast transmitter, a Node B, an evolved Node B, etc. Each base station provides communication coverage for a particular geographic area. The term "cell" can refer to a base station and/or its coverage area depending on the context in which the term is used.

A mobile device may also be referred to as, and may include some or all of the functionality of, a terminal, an access terminal, a user equipment (UE), a subscriber unit, a station, etc. A mobile device may be a cellular phone, a personal digital assistant (PDA), a wireless device, a wireless modem, a handheld device, a laptop computer, etc. A mobile device may communicate with zero, one, or multiple base stations on the downlink (DL) and/or uplink (UL) at any given moment. The downlink (or forward link) refers to the communication link from a base station to the mobile device, and the uplink (or reverse link) refers to the communication link from the mobile device to the base station.

Figure 4:
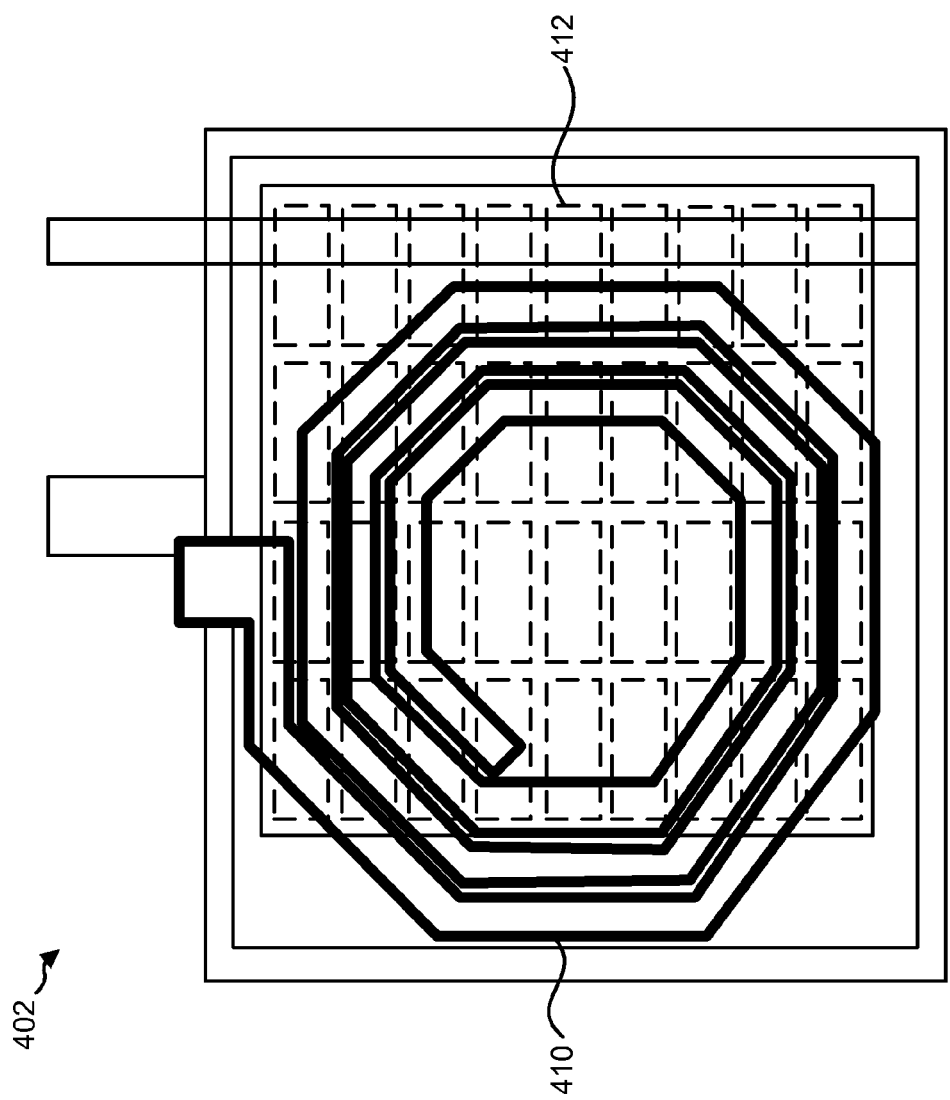
FIG. 4 illustrates an integrated circuit layout for additional circuitry placed underneath an inductor.
Figure 7:
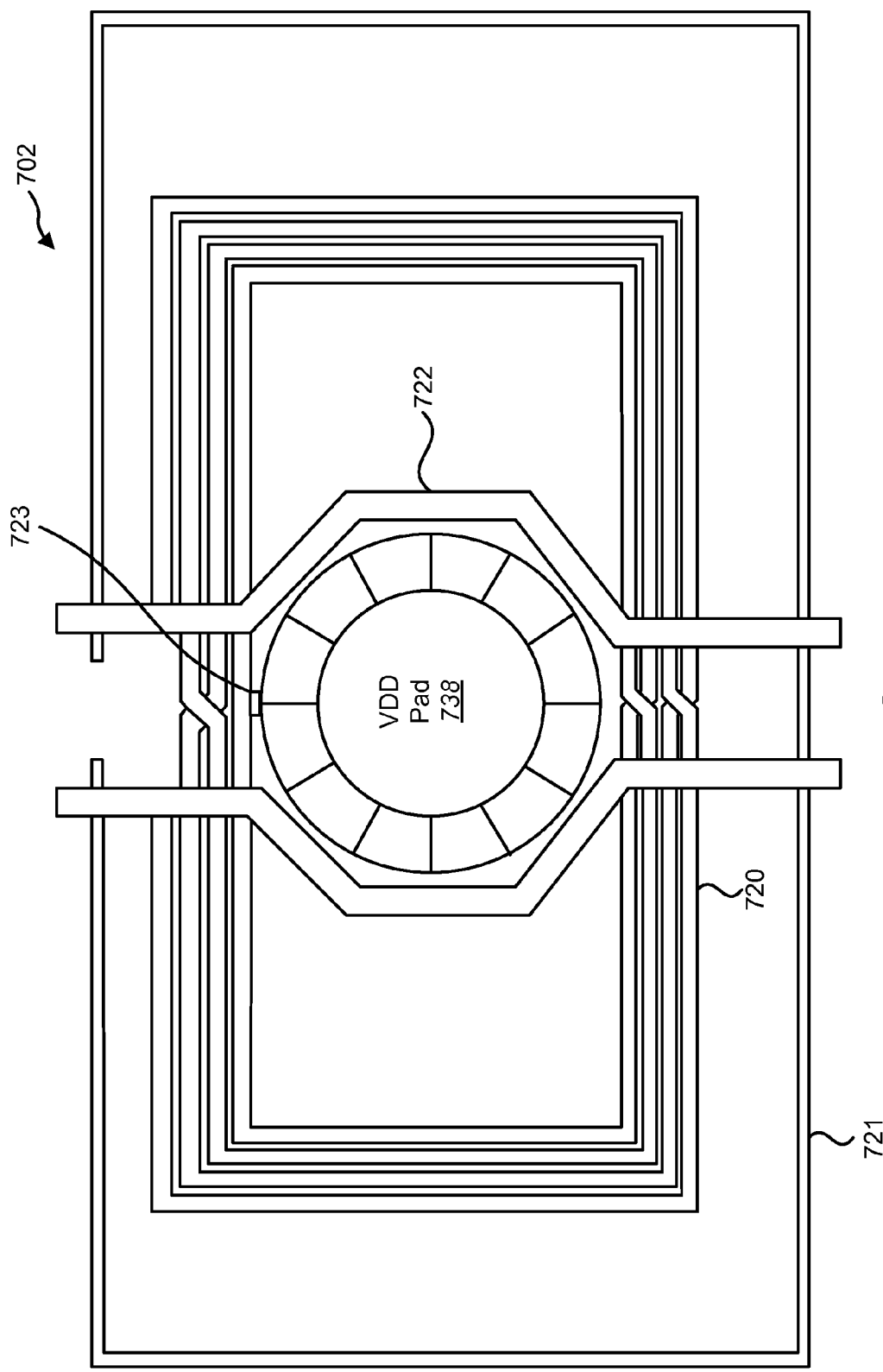
FIG. 7 illustrates an integrated circuit layout for a tank inductor portion of an LNA.

The integrated circuit 102 may include an inductor 104. Many different designs for the inductor 104 may be used. In one configuration, the inductor 104 may use a symmetric design. Alternatively, as shown in FIG. 4 below, the inductor 104 may use an asymmetric spiraling design. As illustrated in FIG. 7 below, the inductor 104 may be designed using multiple loops. Inductors 104 may help low-voltage designed circuits for deep sub-micron technology. Examples of deep sub-micron technology include 65 nanometer (nm), 45 nm, 32 nm and 28 nm technology. However, in deep sub-micron technology, an inductor 104 may become very expensive, due to the large area used by such an inductor 104. Because an inductor 104 is a passive circuit, the size of the inductor 104 may not scale with the technology size used. Thus, in deep sub-micron technology, an inductor 104 will occupy larger chip area on an integrated circuit 102.

An inductor 104 on an integrated circuit 102 may have a large empty area in the center of the inductor 104 due to design constraints. For example, a voltage controlled oscillator (VCO) tank inductor 104 may only have a few turns (or revolutions) to maximize the quality factor (Q) of the inductor, thereby leaving an empty space in the center of the inductor 104 large enough for additional circuitry 106. The large empty area may be suitable for placing additional circuitry 106 on the integrated circuit 102. The additional circuitry 106 may include passive elements (such as inductors, capacitors, and resistors). The additional circuitry 106 may also include active elements (such as transistors). The additional circuitry 106 may create inductive coupling through inductors 104 and lines. The additional circuitry 106 may also create capacitive coupling through parasitic capacitance. The additional circuitry 106 may reduce resistive (substrate) coupling from an inductor 104 because the inductor 104 does not see the substrate due to the circuit in between. To reduce this substrate coupling, the doping profile for certain substrate regions may be changed. The substrate coupling may also be reduced by adding guard rings and other substrate ground connections.

The additional circuitry 106 within the inductor may be arranged such that the inductance and Q of the inductor 104 are not significantly impacted. For example, the additional circuitry 106 may need to be placed in the center of the inductor 104 where the magnetic field is the weakest. Enough distance between the additional circuitry 106 and inductor 104 may be required to allow the magnetic field to pass through. Closed loop routings may be avoided in the additional circuitry 106 placed within the inductor 104. The interaction between the inductor 104 and the additional circuitry 106 may be optimized. For example, the lines that route across the inductor 104 may be perpendicular to the inductor 104 to minimize the coupling.

Figure 2:
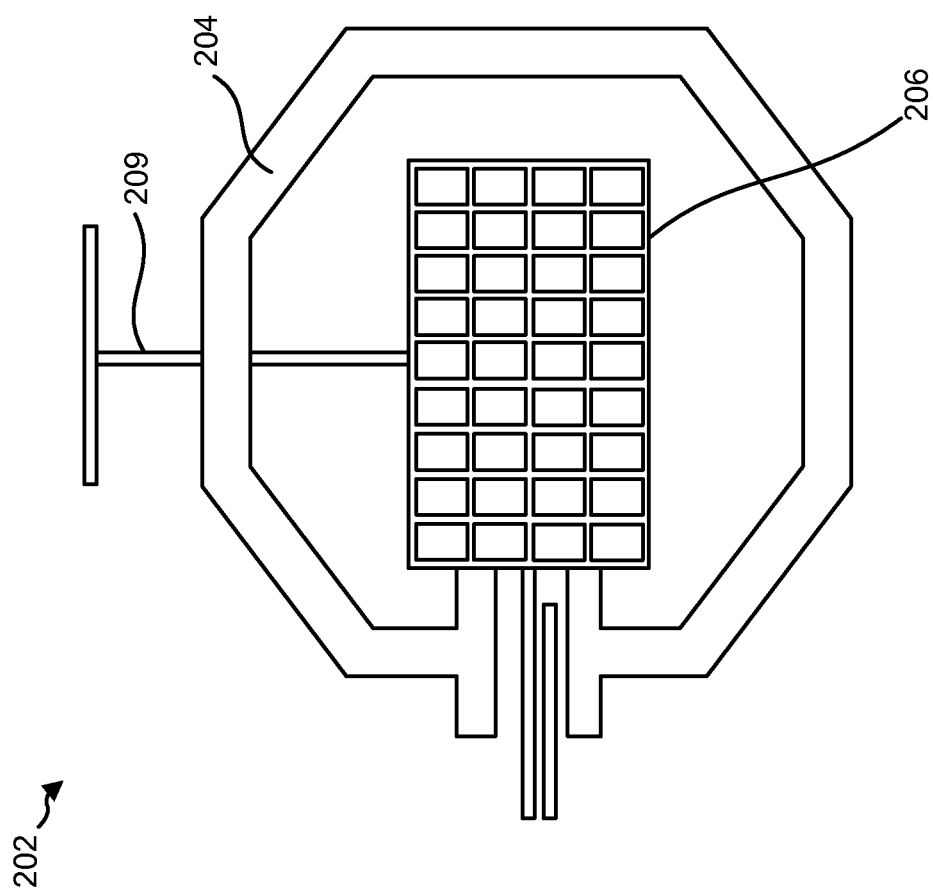
FIG. 2 illustrates an integrated circuit layout for a capacitor bank within an inductor.

FIG. 2 illustrates an integrated circuit layout 202 for a capacitor bank 206 within an inductor 204. A large empty space within the inductor 204 may be available for additional circuitry 106. In FIG. 2, the large empty space within the inductor 204 has been filled with a capacitor bank 206. A capacitor bank 206 may be useful in circuitry such as that for a VCO. A VCO inductor 204 may require an accurate inductance value (L) and Q.

The linearity of the capacitor bank 206 within the inductor 204 may be very similar to the linearity of the capacitor bank 206 outside of the inductor 204. Thus, placing the capacitor bank 206 on the inside of the inductor 204 does not affect the linearity of the capacitor bank 206. Production for an integrated circuit 202 with a capacitor bank 206 within an inductor 204 may thus be realized because the capacitor bank 206 linearity is not affected by the location of the capacitor bank 206. If the inductor 204 with an internal capacitor bank 206 is used in a VCO, the VCO phase noise at 900 kilohertz (kHz) may be degraded by ~2 decibels (dB).

The layout design of the inductor 204 may be optimized based on three dimensional (3D) electromagnetic simulation results. In one configuration, the optimization may result in a stretched coil design, wherein the inductor 204 coils are stretched out. For example, the inductor 204 coils parallel to the corners of the capacitor bank 206 may each be stretched outward from the capacitor bank 206. The stretched coil design may create an inductor 204 with a higher Q factor when circuitry 106 is placed within the inductor 204. The capacitor bank 206 may have a control bus 209. For example, the control bus 209 may include the serial bus interface (SBI) signals that are used to turn on and off the switches to control the total capacitance of the capacitor bank 206.

Figure 3:
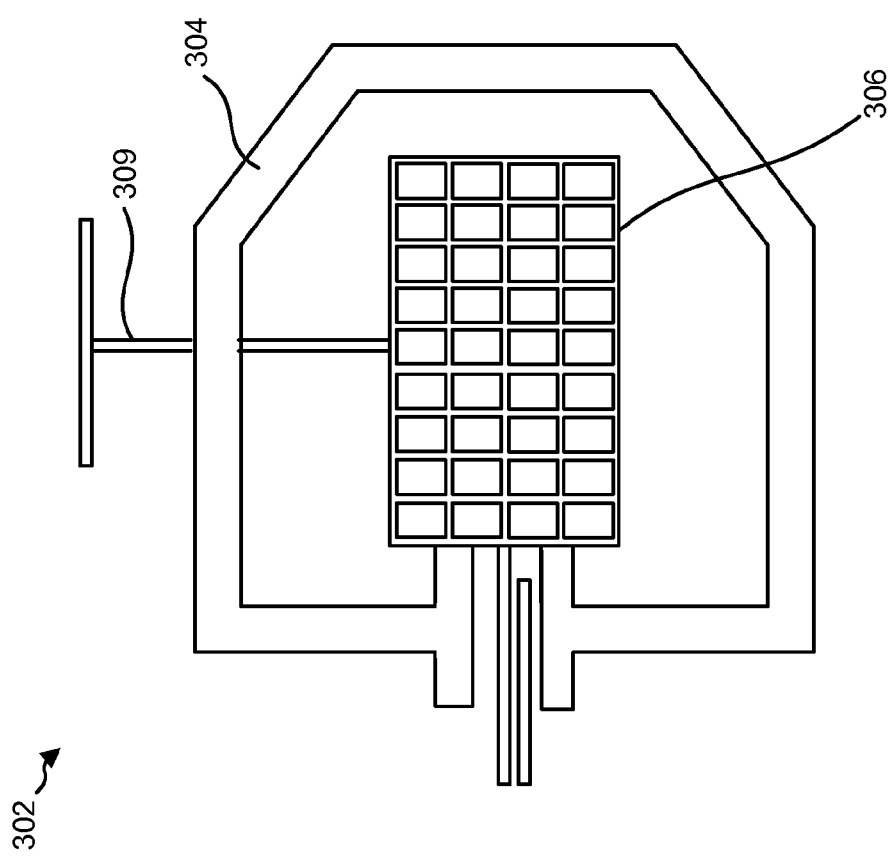
FIG. 3 illustrates an alternative integrated circuit layout for a capacitor bank within an inductor.

FIG. 3 illustrates an alternative integrated circuit layout 302 for a capacitor bank 306 within an inductor 304. The inductor 204 design of FIG. 2 may suffer from negative coupling due to the inductor 204 geometry. In the inductor 204 design of FIG. 2, interaction between the inductor 204 coil and the capacitor bank 206 may result in current crowding. The inductor 304 design of FIG. 3 may minimize the negative coupling between the inductor 304 line. Furthermore, the inductor 304 design of FIG. 3 may have a larger keep out between the inductor 304 coil and the capacitor bank 306. The inductor 304 design of FIG. 3 may use a capacitor bank 306 without a dense layout. The capacitor bank 306 may have a control bus 309.

FIG. 4 illustrates an integrated circuit 402 layout for additional circuitry 412 placed underneath an inductor 410. The inductor 410 and additional circuitry 412 may be part of a VCO. In one configuration, the inductor 410 may be a choke inductor 410. A choke inductor 410 may tolerate a lower Q and a larger L variation. A choke inductor 410 may have a large L such as between 2 and 20 nanoHenry (nH). A choke inductor 410 may also have a small L such as less than 2 nH. The additional circuitry 412 may include transistors, capacitors, etc. on different layers of the integrated circuit 402 than the inductor 410 coil. In one configuration, the additional circuitry 412 placed underneath the inductor 410 may be a mid voltage generator for VCO calibration. The mid voltage generator is powered down after VCO calibration.

The goal of putting the inductor 410 over the blocks of additional circuitry 412 is to save area on the integrated circuit 402 while minimizing the Q degradation due to the coupling to other blocks. The integrated circuit 402 layout of FIG. 4 may be used for a VCO choke inductor 410. A VCO choke inductor 410 is smaller and less sensitive to inductance and Q than other inductors (such as the VCO tank inductor). Thus, the VCO choke inductor 410 is suitable to be placed on top of other blocks. Placing additional circuitry 412 underneath the choke inductor 410 may not affect VCO performance. The choke inductor 410 may be placed over active circuitry 412 without a keep out and ground ring. Capacitive coupling may also be minimized.

Figure 5:
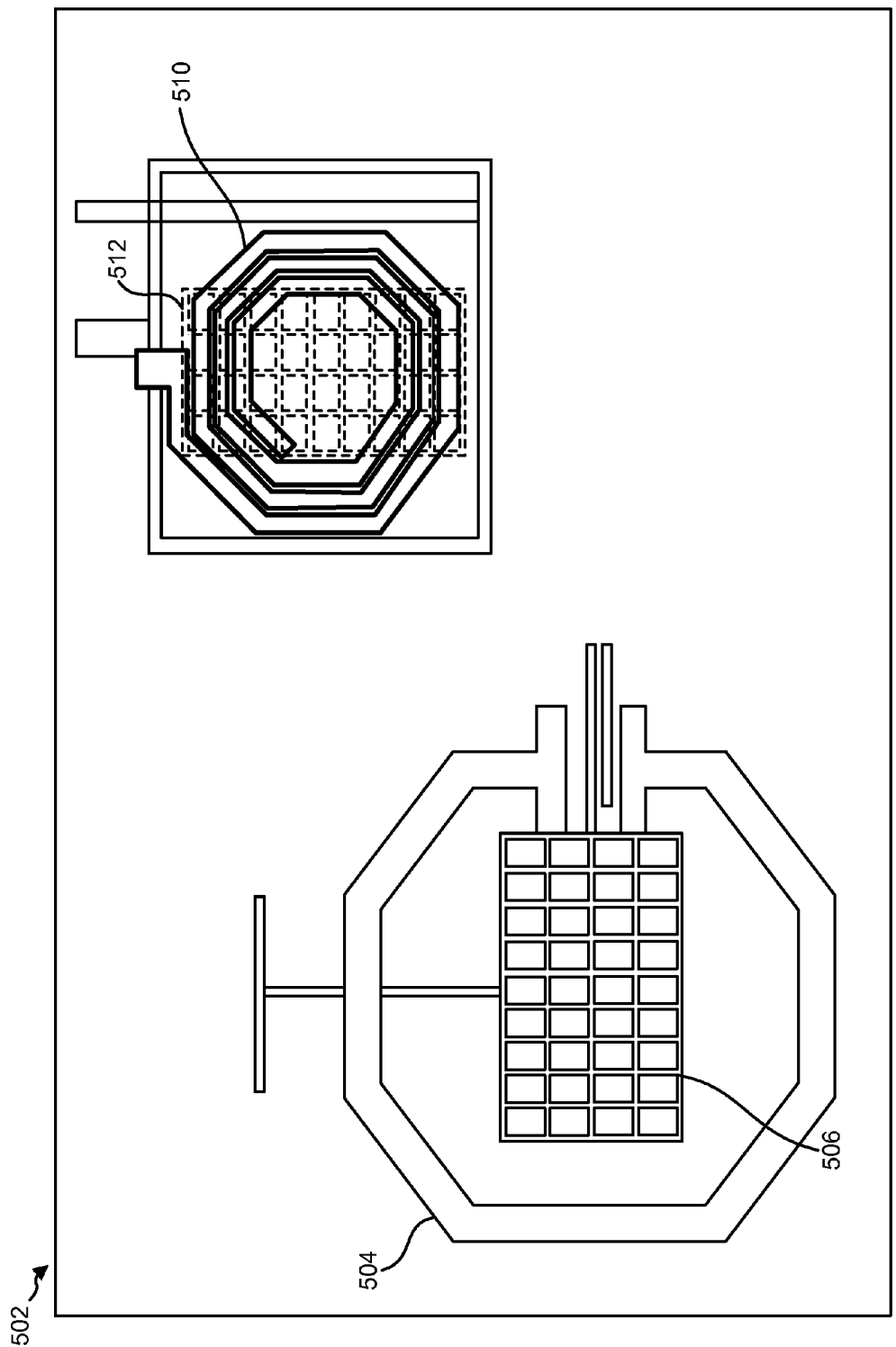
FIG. 5 illustrates an integrated circuit layout for portions of a receiving (RX) voltage controlled oscillator (VCO)

FIG. 5 illustrates an integrated circuit 502 layout for portions of a receiving (RX) voltage controlled oscillator (VCO). The RX VCO may include a tank inductor 504. The RX VCO may also include a capacitor bank 506 located within the tank inductor 504. The RX VCO may also include a choke inductor 510. The RX VCO may further include a mid voltage generator 512 for VCO calibration located underneath the choke inductor 510.

Figure 6:
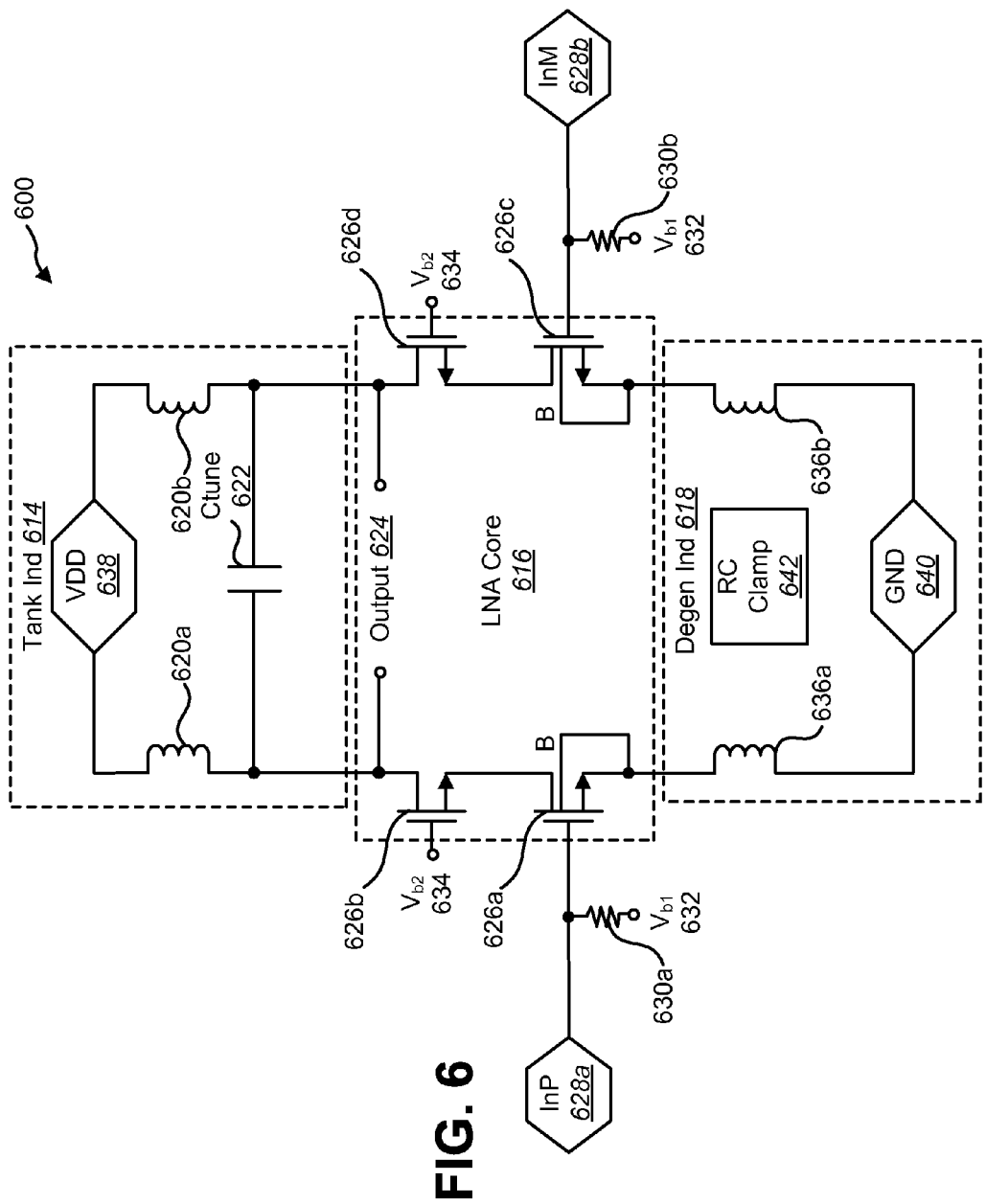
FIG. 6 is a circuit diagram illustrating a low noise amplifier (LNA)

FIG. 6 is a circuit diagram illustrating a low noise amplifier (LNA) 600. The LNA 600 may include a tank inductor portion 614. In one configuration, the tank inductor portion 614 may include a first inductor 620a and a second inductor 620b. Each of the two inductors 620 may be attached to VDD 638 and to each side of a capacitor Ctune 622. The tank inductor portion 614 may include a VDD 638 pad.

The LNA 600 may also include an LNA core portion 616 attached to inputs InP 628a and InM 628b of the LNA 600. The input InP 628a may be connected to a resistor 630a connected to a first bias voltage Vb1 632. The input InP 628a may also be connected to the gate of a first negative metal-oxide-semiconductor (NMOS) field-effect transistor 626a. The substrate of the first NMOS transistor 626a may be connected to the source of the first NMOS transistor 626a. The drain of the first NMOS transistor 626a may be connected to the source of a second NMOS transistor 626b. The gate of the second NMOS transistor 626b may be connected to a second bias voltage Vb2 634. The drain of the second NMOS transistor 626b may be connected to an output 624 of the LNA 600, the first inductor 620a, and the capacitor 622.

The input InM 628b may be connected to a resistor 630b connected to Vb1 632. The input InM 628b may also be connected to the gate of a third NMOS transistor 626c. The substrate of the third NMOS transistor 626c may be connected to the source of the third NMOS transistor 626c. The drain of the third NMOS transistor 626c may be connected to the source of a fourth NMOS transistor 626d. The gate of the fourth NMOS transistor 626d may be connected to Vb2 634. The drain of the fourth NMOS transistor 626d may be connected to an output 624 of the LNA 600, the second inductor 620b, and the capacitor 622.

The LNA 600 may further include a Degeneration inductor portion 618. In one configuration, the Degeneration inductor portion 618 of the LNA 600 may include a third inductor 636a and a fourth inductor 636b. The LNA Degeneration inductors 636 may need an accurate L and Q. Thus, a keep out may be placed under the coil of an LNA Degeneration inductor 636. The keep out may keep current crowding to a minimum. The third inductor 636a may be connected to the source of the first NMOS transistor 626a and to ground (GND) 640. The fourth inductor 636b may be connected to the source of the third NMOS transistor 626b and to GND 640. The Degeneration inductor portion 618 may also include a resistor-capacitor (RC) clamp 642. The RC clamp 642 may be ESD protection circuitry used to protect the circuitry from electrostatic charge damage. Additional ESD protection circuitry/devices and other non-critical circuits may be used under inductors 636. The additional ESD protection circuitry/devices and other non-critical circuits may be powered off when critical RF circuits are operating. The Degeneration inductor portion 618 may include ground 640 pads.

FIG. 7 illustrates an integrated circuit 702 layout for a tank inductor portion 614 of an LNA 600. The integrated circuit 702 layout of FIG. 7 may be one layout for the tank inductor portion 614 of FIG. 6. The integrated circuit 702 layout may include an inductor 720 with a large empty space inside of the inductor 720. A guard ring 721 may be placed around the inductor 720. A VDD pad 738 may be placed inside the large empty space of the inductor 720. A center tap 723 may be connected to the VDD pad 738. The inductor 720 may have a plus terminal and a minus terminal in addition to the center tap 723. Routing lines 722 may be used to cross the inductor 720 and connect to the VDD pad 738.

Figure 8:
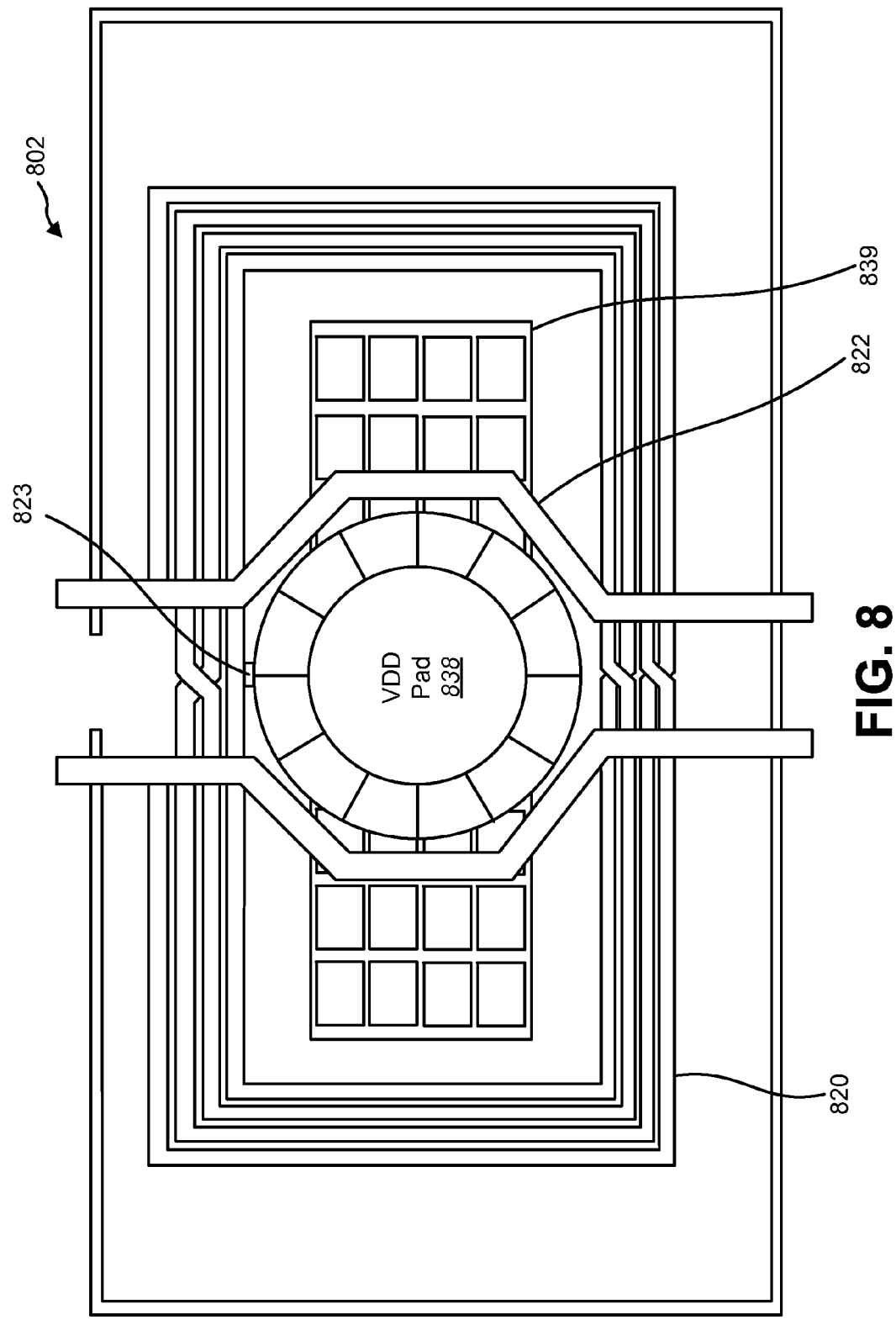
FIG. 8 illustrates an integrated circuit layout for a tank inductor with a capacitor bank as part of an LNA.

FIG. 8 illustrates an integrated circuit 802 layout for a tank inductor 820 with a capacitor bank 839 as part of an LNA 600. The integrated circuit 802 layout of FIG. 8 may be one spatial layout for the tank inductor portion 614 of the LNA 600 of FIG. 6. The capacitor bank 839 may be placed within the tank inductor 820. A VDD pad 838 may also be placed within the tank inductor 820. A center tap 823 may be connected to the VDD pad 838. The inductor 820 may have a plus terminal and a minus terminal in addition to the center tap 823. Routing lines 822 may be used to cross the inductor 820 to provide a connection to the LNA 600 while routing across the inductor to reach the mixer.

Figure 9:
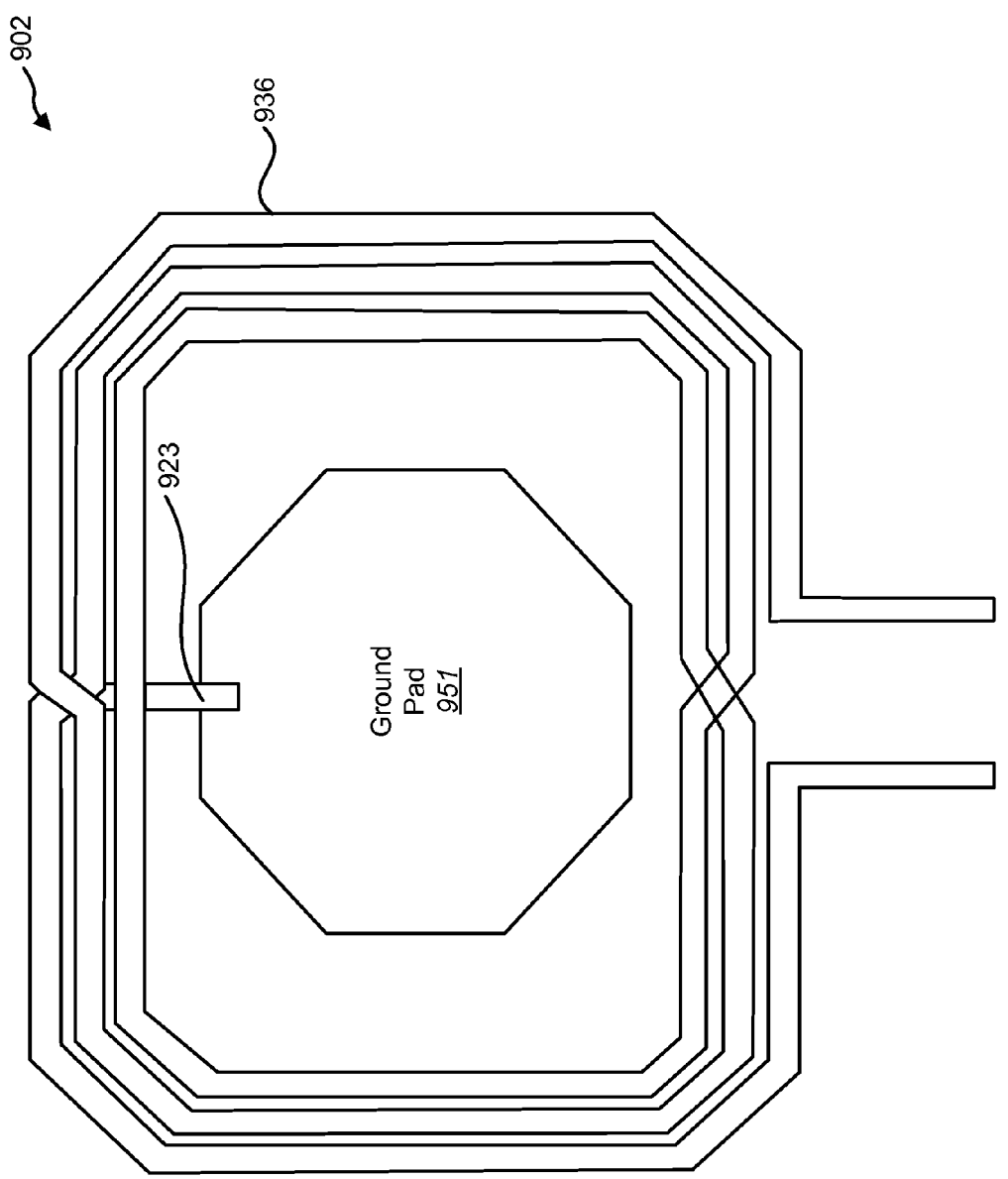
FIG. 9 illustrates an integrated circuit layout for a degeneration inductor portion of an LNA.

FIG. 9 illustrates an integrated circuit 902 layout for a Degeneration inductor portion 618 of an LNA 600. The integrated circuit 902 layout of FIG. 9 may be one layout for the Degeneration inductor portion 618 of FIG. 6. The integrated circuit 602 layout may include an inductor 936 with a large empty space inside the inductor 936. A ground (GND) pad 951 may be placed inside the large empty space of the inductor 936. Other package pads (not shown) such as an ESD pad or a supply pad may also be placed inside the large empty space of the inductor 936. A center tap 923 may be connected to the ground pad 951.

Figure 10:
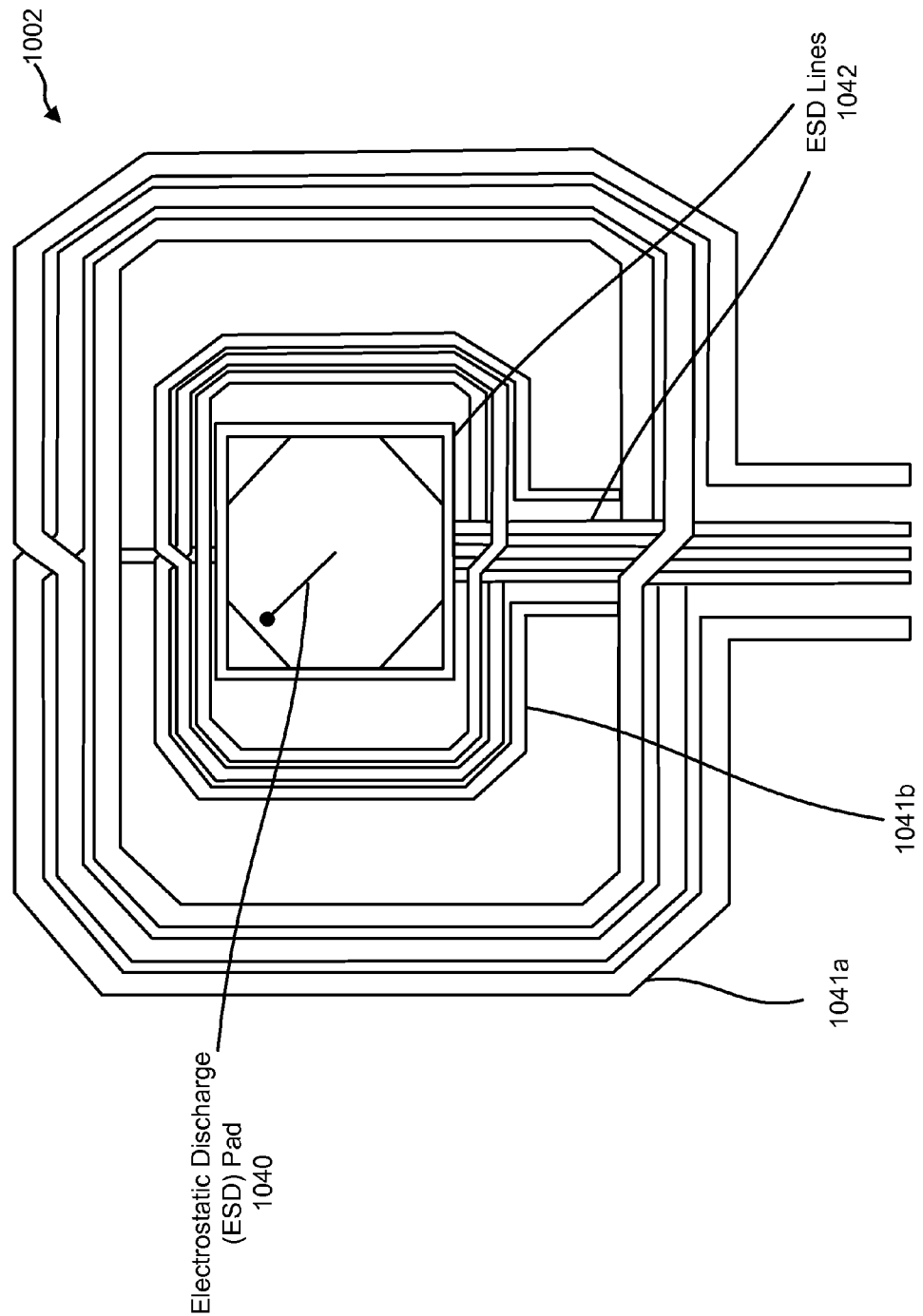
FIG. 10 illustrates another integrated circuit layout for a degeneration inductor portion of an LNA.

FIG. 10 illustrates another integrated circuit 1002 layout for a Degeneration inductor portion 618 of an LNA 600. The integrated circuit 1002 layout may include one or more Degeneration inductors 1041. In one configuration, a first Degeneration inductor 1041a may include a second Degeneration inductor 1041b within a large empty space inside of the first Degeneration inductor 1041a. An empty space may be included within the second Degeneration inductor 1041b. Within the empty space of the second Degeneration inductor 1041b, an electrostatic discharge (ESD) pad 1040 may be placed. ESD lines 1042 may also be placed on the integrated circuit 1002 layout.

Figure 11:
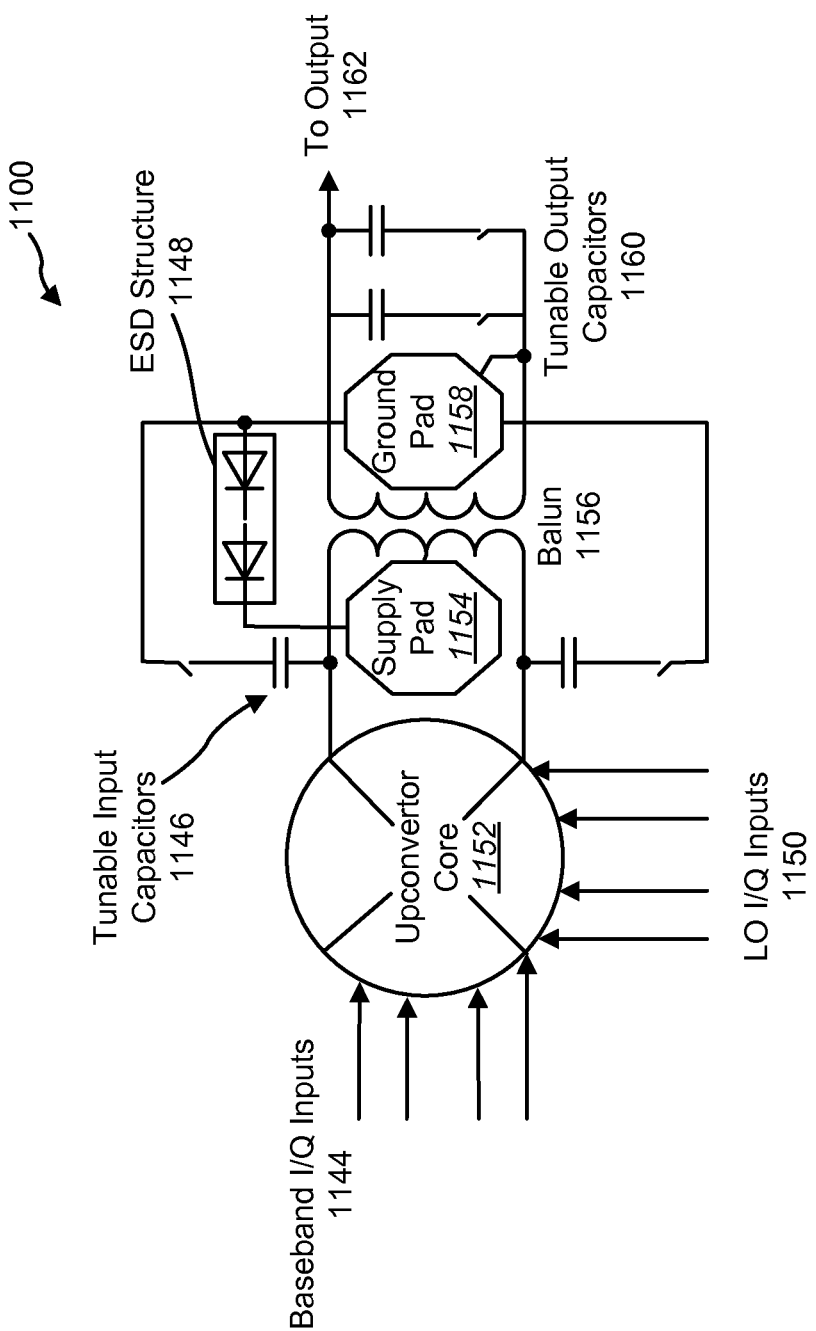
FIG. 11 is a circuit diagram of an upconverter for use in a radio frequency (RF) chip.

FIG. 11 is a circuit diagram of an upconverter 1100 for use in a radio frequency (RF) chip. The upconverter 1100 may include an upconverter core 1152. The upconverter core 1152 may receive baseband I/Q inputs 1144 and LO I/Q inputs 1150. The upconverter 1100 in an RF chip may require a balun 1156 to convert differential signals to a single ended output 1162. The upconverter 1100 may also require several tuning elements. Typically, the tuning elements may include tunable input capacitors 1146 and tunable output capacitors 1160. Practical RF chips may need to accommodate pad structures that deliver power from outside the die to the upconverter 1100 circuit (supply pad 1154) and also provide a ground connection (ground pad 1158) to the die.

The balun 1156 is an electromagnetic structure constructed by having coils of metal wound around a periphery. The center of the coil winding may be left empty. This empty area is wasteful, particularly for the finer complementary metal-oxide-semiconductor (CMOS) technologies, where the die cost is much higher. By using the empty area, the cost of RF chips constructed in fine CMOS technologies may be lowered. The empty area may be filled with elements such as the input tuning capacitors 1146, the output tuning capacitors 1160, a ground pad 1158, a supply pad 1154, and ESD protection structures 1148 for the supply pad 1154.

Figure 12:
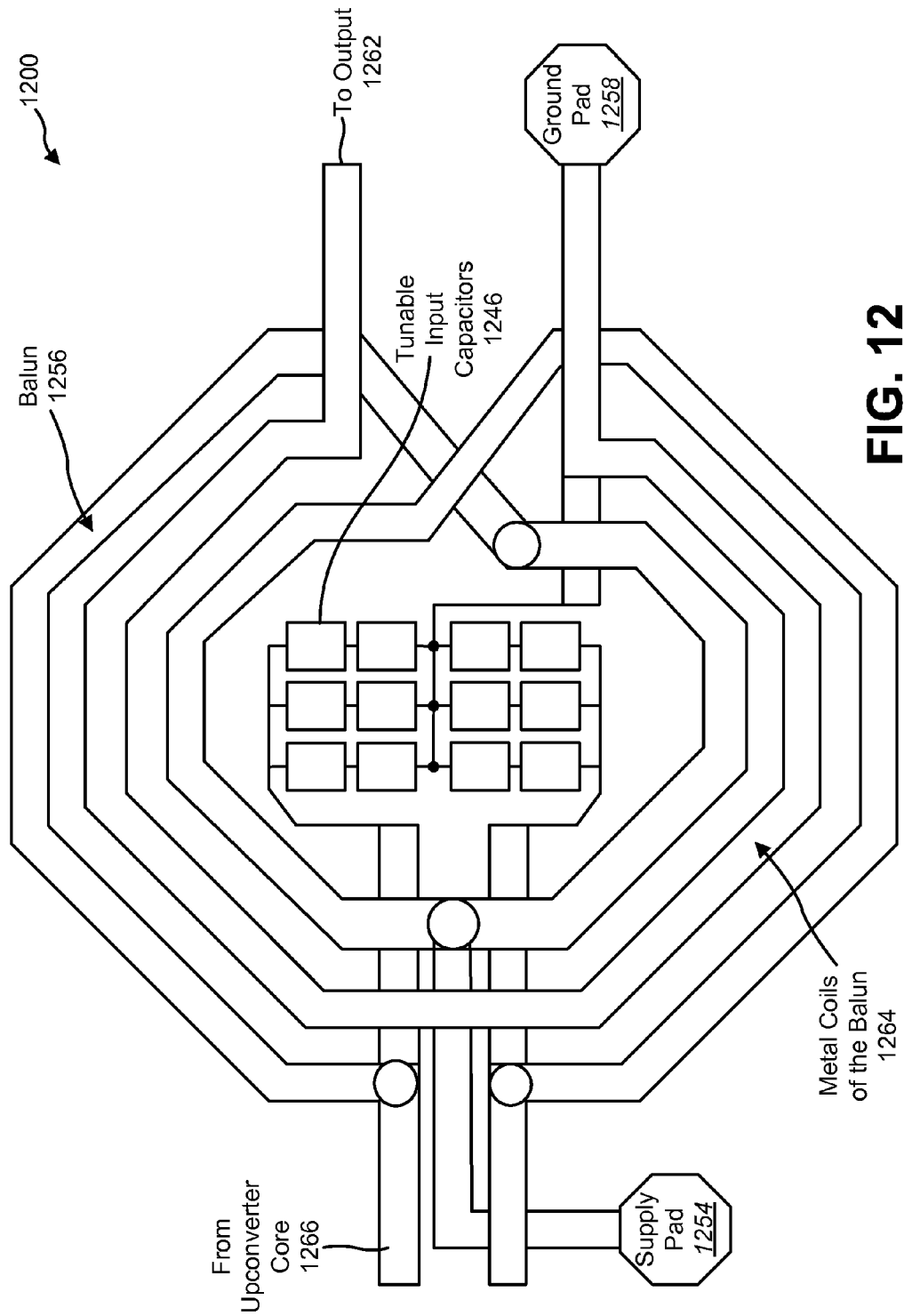
FIG. 12 illustrates the spatial location of a balun with tunable input capacitors within the balun.

FIG. 12 illustrates the spatial location 1200 of a balun 1256 with tunable input capacitors 1246 within the balun 1256. The balun 1256 may be created by winding metal coils 1264. The tunable input capacitors 1246 may be placed in the empty space at the center of the balun 1256 metal coils 1264. The balun 1256 may receive an input 1266 from the upconverter core 1152. The balun 1256 may also be connected to a supply pad 1254 and to a ground pad 1258. The balun 1256 may further be connected to an output 1262. The placement of the tunable input capacitors 1246 within the balun 1256 may be such that the tunable input capacitors 1246 and the balun 1256 do not negatively affect each other.

Figure 13:
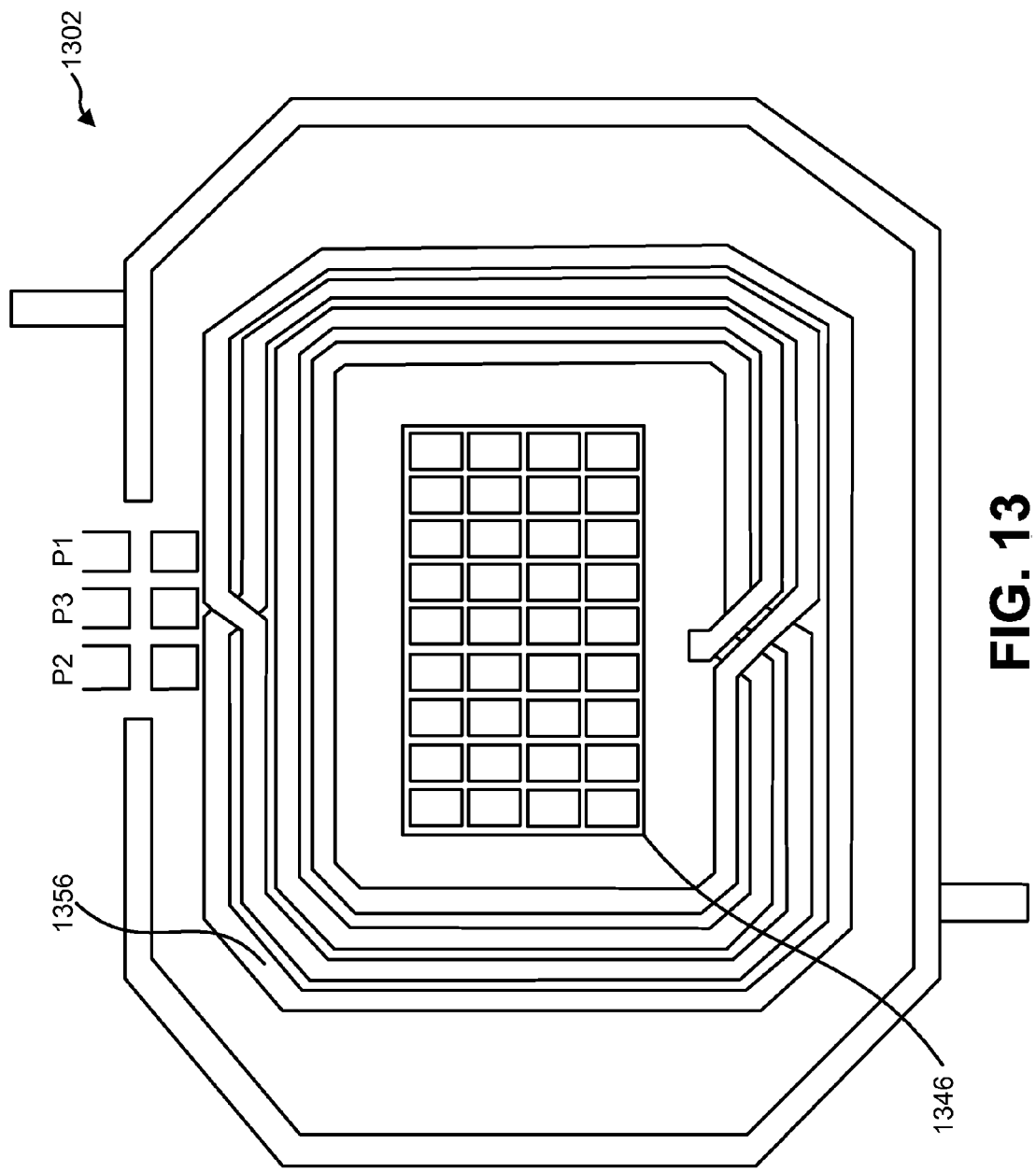
FIG. 13 illustrates another spatial layout of a balun with tunable input capacitors within the balun.

FIG. 13 illustrates another spatial layout 1302 of a balun 1356 with tunable input capacitors 1346 within the balun 1356. The tunable input capacitors 1356 may be located on the same layer as the balun 1356. Because the balun 1356 is constructed using coils of metal wound around a periphery, the tunable input capacitors 1346 may be placed within the balun 1356. As discussed above, other circuitry in addition to or in place of tunable input capacitors 1346 may be placed within the balun 1356. For example, tunable output capacitors 1146, a ground pad 1158, a supply pad 1154, or an ESD protection structure 1148 for the supply pad 1154 may be placed within the balun 1356. The circuitry within the balun 1356 may be arranged such that the inductance and Q of the balun 1356 are not negatively impacted.

A 3-D EM solver indicates that the balun 1356 performance including inductance, Q, resonance, and coupling factor are almost unchanged with the addition of the circuitry. A 3-D EM solver setup of the balun 1356 on an integrated circuit with a capacitor bank placed within the balun 1356 indicates that a capacitor bank may be placed within the balun 1356 without negatively affecting the performance of the balun 1356 or the capacitor bank. The capacitor bank may be placed on the same layer as the balun 1356.

Figure 14:
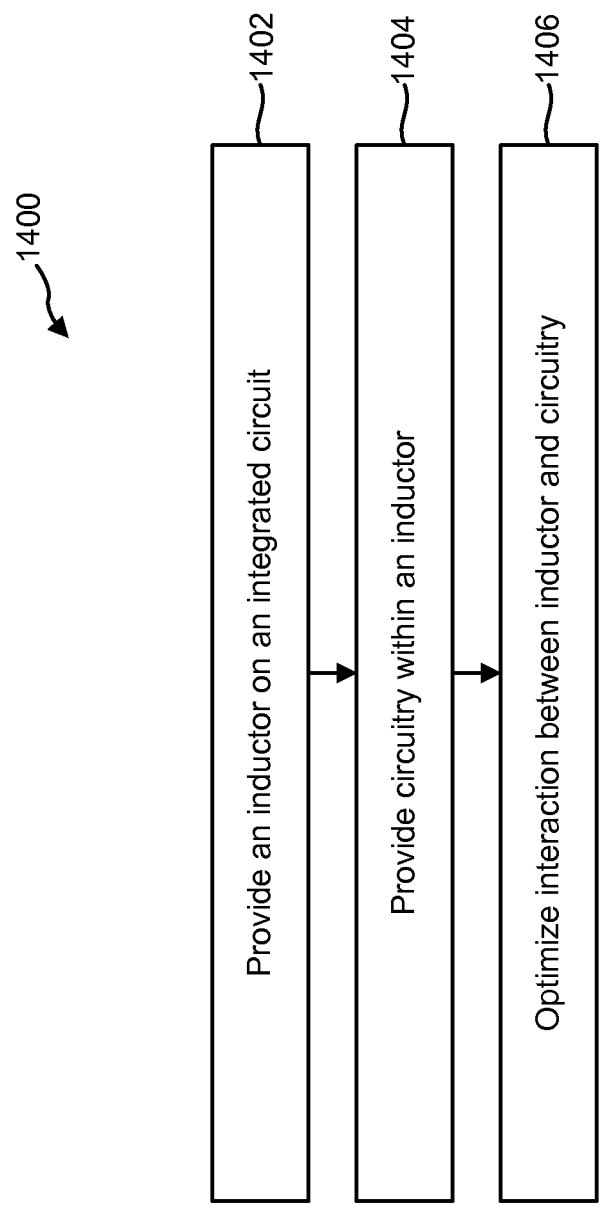
FIG. 14 is a flow diagram of a method for providing circuitry within an inductor on an integrated circuit.

FIG. 14 is a flow diagram of a method 1400 for providing circuitry 106 within an inductor 104 on an integrated circuit 102. An inductor 104 may be provided 1402 on an integrated circuit 102. Circuitry 106 may be provided 1404 within the inductor 104. The interaction between the inductor 104 and the circuitry 106 may then be optimized 1406.

Figure 15:
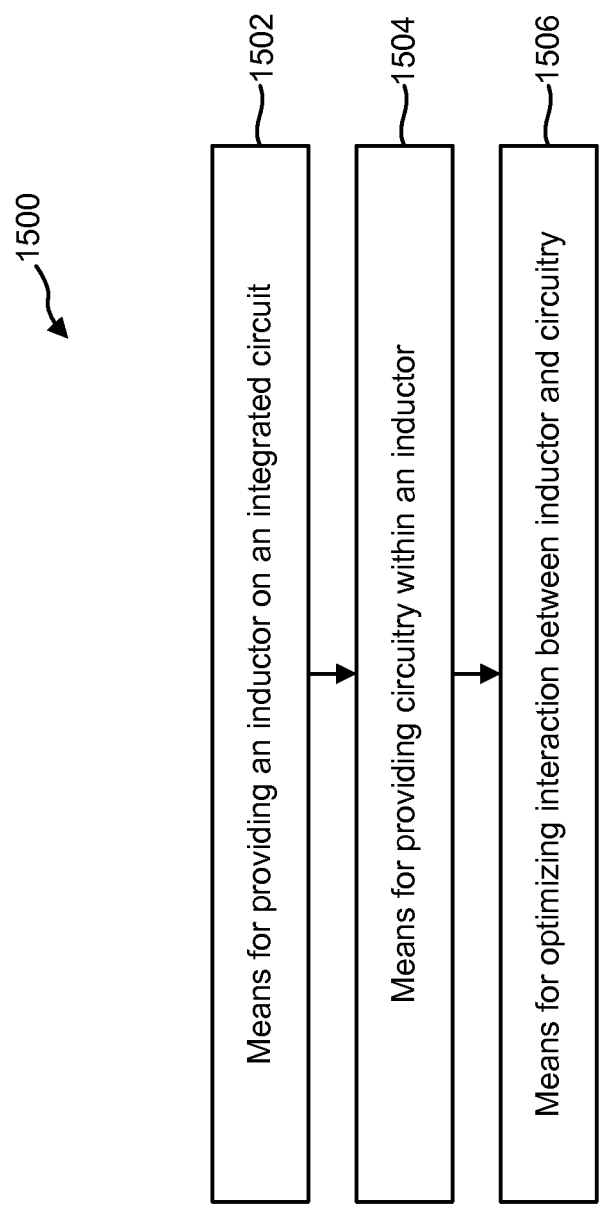
FIG. 15 illustrates means-plus-function blocks corresponding to the method of FIG. 14.

The method 1400 of FIG. 14 described above may be performed by various hardware and/or software component(s) and/or module(s) corresponding to the means-plus-function blocks 1500 illustrated in FIG. 15. In other words, blocks 1402 through 1406 illustrated in FIG. 14 correspond to means-plus-function blocks 1502 through 1506 illustrated in FIG. 15.

Figure 16:
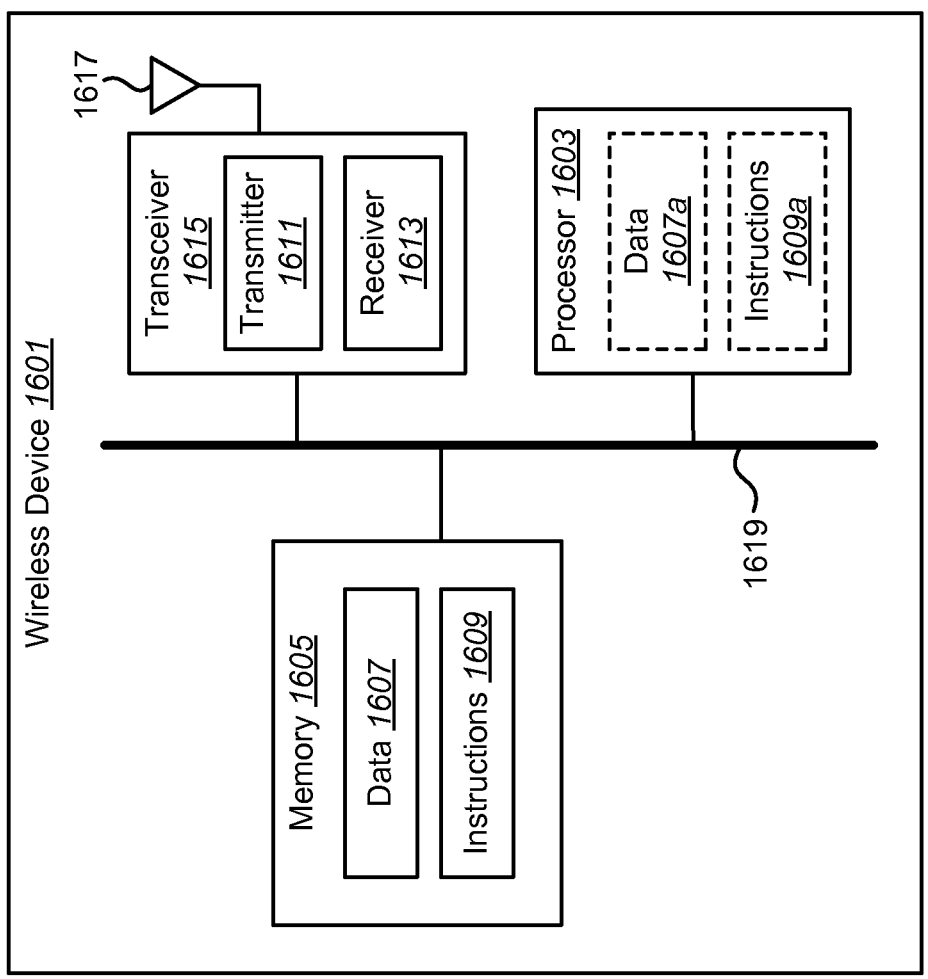
FIG. 16 illustrates certain components that may be included within a wireless device that is configured in accordance with the present disclosure.

FIG. 16 illustrates certain components that may be included within a wireless device 1601. The wireless device 1601 may be a mobile device or a base station and may implement the present systems and methods as disclosed herein.

The wireless device 1601 includes a processor 1603. The processor 1603 may be a general purpose single- or multi-chip microprocessor (e.g., an ARM), a special purpose microprocessor (e.g., a digital signal processor (DSP)), a microcontroller, a programmable gate array, etc. The processor 1603 may be referred to as a central processing unit (CPU). Although just a single processor 1603 is shown in the wireless device 1601 of FIG. 16, in an alternative configuration, a combination of processors (e.g., an ARM and DSP) could be used.

The wireless device 1601 also includes memory 1605. The memory 1605 may be any electronic component capable of storing electronic information. The memory 1605 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1607 and instructions 1609 may be stored in the memory 1605. The instructions 1609 may be executable by the processor 1603 to implement the methods disclosed herein. Executing the instructions 1609 may involve the use of the data 1607 that is stored in the memory 1605. When the processor 1603 executes the instructions 1607, various portions of the instructions 1607a may be loaded onto the processor 1603, and various pieces of data 1609a may be loaded onto the processor 1603.

The wireless device 1601 may also include a transmitter 1611 and a receiver 1613 to allow transmission and reception of signals to and from the wireless device 1601. The transmitter 1611 and receiver 1613 may be collectively referred to as a transceiver 1615. An antenna 1617 may be electrically coupled to the transceiver 1615. The wireless device 1601 may also include multiple transmitters, multiple receivers, multiple transceivers and/or multiple antennas (not shown).

The various components of the wireless device 1601 may be coupled together by one or more buses, which may include a power bus, a control signal bus, a status signal bus, a data bus, etc. For the sake of clarity, the various buses are illustrated in FIG. 16 as a bus system 1619.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 14 and 15, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit comprising:
an inductor comprising a coil portion and an empty area in the center of the coil portion, wherein the inductor is a degeneration inductor that is part of a low noise amplifier (LNA);
additional circuitry, wherein the additional circuitry is located within the empty area in the center of the coil portion, wherein the additional circuitry is arranged such that an impact of the additional circuitry on an inductance and a quality factor of the inductor is minimized, and wherein the additional circuitry comprises a resistor capacitor (RC) clamp; and
routing lines connected to the additional circuitry that extend across the coil portion and that are positioned to reduce inductive coupling between the additional circuitry and the inductor.

2. An integrated circuit comprising:
an inductor comprising a coil portion and an empty area in the center of the coil portion, wherein the inductor is a degeneration inductor that is part of a low noise amplifier (LNA);
additional circuitry, wherein the additional circuitry is located within the empty area in the center of the coil portion, wherein the additional circuitry is arranged such that an impact of the additional circuitry on an inductance and a quality factor of the inductor is minimized, and wherein the additional circuitry comprises an electrostatic discharge (ESD) pad; and
routing lines connected to the additional circuitry that extend across the coil portion and that are positioned to reduce inductive coupling between the additional circuitry and the inductor.

3. An integrated circuit comprising:
an inductor comprising a coil portion and an empty area in the center of the coil portion, wherein the inductor is a degeneration inductor that is part of a low noise amplifier (LNA);
additional circuitry, wherein the additional circuitry is located within the empty area in the center of the coil portion, wherein the additional circuitry is arranged such that an impact of the additional circuitry on an inductance and a quality factor of the inductor is minimized, and wherein the additional circuitry comprises electrostatic discharge (ESD) lines; and
routing lines connected to the additional circuitry that extend across the coil portion and that are positioned to reduce inductive coupling between the additional circuitry and the inductor.

4. An integrated circuit comprising:
an inductor comprising a coil portion and an empty area in the center of the coil portion, wherein the inductor is a balun;
additional circuitry, wherein the additional circuitry is located within the empty area in the center of the coil portion, wherein the additional circuitry is arranged such that an impact of the additional circuitry on an inductance and a quality factor of the inductor is minimized; and
routing lines connected to the additional circuitry that extend across the coil portion and that are positioned to reduce inductive coupling between the additional circuitry and the inductor.

5. The integrated circuit of claim 4, wherein the additional circuitry comprises at least one of input tuning capacitors, output tuning capacitors, a ground pad, a supply pad, and electrostatic discharge (ESD) protection structures for the supply pad.

6. A method for providing circuitry within an inductor, the method comprising:
providing an inductor on an integrated circuit, the inductor comprising a coil portion and an empty area in the center of the coil portion, wherein the inductor is a degeneration inductor that is part of a low noise amplifier (LNA);
providing additional circuitry within the inductor, wherein the additional circuitry is located within the empty area in the center of the coil portion, wherein the additional circuitry is arranged such that an impact of the additional circuitry on an inductance and a quality factor of the inductor is minimized, and wherein the additional circuitry comprises a resistor capacitor (RC) clamp; and providing routing lines connected to the additional circuitry that extend across the coil portion and that are positioned to reduce inductive coupling between the additional circuitry and the inductor.

7. A method for providing circuitry within an inductor, the method comprising:

providing an inductor on an integrated circuit, the inductor comprising a coil portion and an empty area in the center of the coil portion, wherein the inductor is a degeneration inductor that is part of a low noise amplifier (LNA);

providing additional circuitry within the inductor, wherein the additional circuitry is located within the empty area in the center of the coil portion, wherein the additional circuitry is arranged such that an impact of the additional circuitry on an inductance and a quality factor of the inductor is minimized, and wherein the additional circuitry comprises an electrostatic discharge (ESD) pad; and providing routing lines connected to the additional circuitry that extend across the coil portion and that are positioned to reduce inductive coupling between the additional circuitry and the inductor.

8. A method for providing circuitry within an inductor, the method comprising:

providing an inductor on an integrated circuit, the inductor comprising a coil portion and an empty area in the center of the coil portion, wherein the inductor is a degeneration inductor that is part of a low noise amplifier (LNA);

providing additional circuitry within the inductor, wherein the additional circuitry is located within the empty area in the center of the coil portion, wherein the additional circuitry is arranged such that an impact of the additional circuitry on an inductance and a quality factor of the inductor is minimized, and wherein the additional circuitry comprises electrostatic discharge (ESD) lines; and providing routing lines connected to the additional circuitry that extend across the coil portion and that are positioned to reduce inductive coupling between the additional circuitry and the inductor.

9. A method for providing circuitry within an inductor, the method comprising:

providing an inductor on an integrated circuit, the inductor comprising a coil portion and an empty area in the center of the coil portion, wherein the inductor is a balun;

providing additional circuitry within the inductor, wherein the additional circuitry is located within the empty area in the center of the coil portion, wherein the additional circuitry is arranged such that an impact of the additional circuitry on an inductance and a quality factor of the inductor is minimized; and providing routing lines connected to the additional circuitry that extend across the coil portion and that are positioned to reduce inductive coupling between the additional circuitry and the inductor.

10. The method of claim 9, wherein the additional circuitry comprises at least one of input tuning capacitors, output tuning capacitors, a ground pad, a supply pad, and electrostatic discharge (ESD) protection structures for the supply pad.

11. An integrated circuit comprising:

an inductor comprising a coil portion and an empty area in the center of the coil portion, wherein the inductor has a stretched coil design;

additional circuitry, wherein the additional circuitry is located within the empty area in the center of the coil portion, wherein the additional circuitry is arranged such that an impact of the additional circuitry on an inductance and a quality factor of the inductor is minimized; and routing lines connected to the additional circuitry that extend across the coil portion and that are positioned to reduce inductive coupling between the additional circuitry and the inductor.

12. The integrated circuit of claim 11, wherein the additional circuitry comprises a capacitor bank.

13. The integrated circuit of claim 11, wherein the inductor is a tank inductor that is part of a voltage controlled oscillator (VCO).

14. The integrated circuit of claim 11, wherein the inductor is a tank inductor that is part of a low noise amplifier (LNA).

15. The integrated circuit of claim 14, wherein the additional circuitry comprises a tuning capacitor.

16. The integrated circuit of claim 14, wherein the additional circuitry comprises a supply voltage pad.

17. The integrated circuit of claim 11, wherein the inductor is a degeneration inductor that is part of a low noise amplifier (LNA).

18. The integrated circuit of claim 17, wherein the additional circuitry comprises a ground pad.

19. A method for providing circuitry within an inductor, the method comprising:

providing an inductor on an integrated circuit, the inductor comprising a coil portion and an empty area in the center of the coil portion, wherein the inductor has a stretched coil design;

providing additional circuitry within the inductor, wherein the additional circuitry is located within the empty area in the center of the coil portion, wherein the additional circuitry is arranged such that an impact of the additional circuitry on an inductance and a quality factor of the inductor is minimized; and providing routing lines connected to the additional circuitry that extend across the coil portion and that are positioned to reduce inductive coupling between the additional circuitry and the inductor.

20. The method of claim 19, wherein the additional circuitry comprises a capacitor bank.

21. The method of claim 19, wherein the inductor is a tank inductor that is part of a voltage controlled oscillator (VCO).

22. The method of claim 19, wherein the inductor is a tank inductor that is part of a low noise amplifier (LNA).

23. The method of claim 22, wherein the additional circuitry comprises a tuning capacitor.

24. The method of claim 22, wherein the additional circuitry comprises a supply voltage pad.

25. The method of claim 19, wherein the inductor is a degeneration inductor that is part of a low noise amplifier (LNA).

26. The method of claim 25, wherein the additional circuitry comprises a ground pad.

27. An apparatus for providing circuitry within an inductor, comprising:

means for providing an inductor on an integrated circuit, wherein the inductor has a stretched coil design;

means for providing additional circuitry within the inductor, wherein the additional circuitry is located within the empty area in the center of the inductor, wherein the additional circuitry is arranged such that an impact of the additional circuitry on an inductance and a quality factor of the inductor is minimized, and wherein the additional circuitry comprises a capacitor bank; and means for providing routing lines connected to the additional circuitry that extend across the inductor and that are positioned to reduce inductive coupling between the additional circuitry and the inductor.

28. The apparatus of claim 27, wherein the additional circuitry comprises a capacitor bank.

29. The apparatus of claim 27, wherein the inductor comprises a tank inductor that is part of a voltage controlled oscillator (VCO).

* * * * *